United States Patent
Bucklen

(10) Patent No.: US 7,307,562 B2
(45) Date of Patent: Dec. 11, 2007

(54) SPECTRALLY-ADJUSTED SAMPLING METHODS AND STRUCTURES FOR DIGITAL DISPLAYS

(75) Inventor: Willard Kraig Bucklen, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 156 days.

(21) Appl. No.: 11/360,171

(22) Filed: Feb. 22, 2006

(65) Prior Publication Data
US 2007/0194969 A1 Aug. 23, 2007

(51) Int. Cl.
*H03M 1/00* (2006.01)

(52) U.S. Cl. ................................ 341/123; 341/122

(58) Field of Classification Search ......... 341/122–155
See application file for complete search history.

(56) References Cited

U.S. PATENT DOCUMENTS

| | | | |
|---|---|---|---|
| 5,325,195 A * | 6/1994 | Ellis et al. ................. | 348/189 |
| 5,796,392 A | 8/1998 | Eglit ......................... | 345/213 |
| 6,268,848 B1 | 7/2001 | Eglit ......................... | 345/213 |
| 6,307,498 B1 | 10/2001 | Eglit ......................... | 341/155 |
| 6,320,574 B1 | 11/2001 | Eglit ......................... | 345/213 |
| 6,459,426 B1 | 10/2002 | Eglit ......................... | 345/213 |
| 6,483,447 B1 | 11/2002 | Eglit ......................... | 345/111 |
| 6,975,362 B2 * | 12/2005 | Sani et al. ................. | 348/446 |
| 7,088,276 B1 * | 8/2006 | Wegener .................... | 341/155 |
| 7,154,495 B1 * | 12/2006 | Bucklen .................... | 345/213 |

* cited by examiner

*Primary Examiner*—Lam T. Mai
(74) *Attorney, Agent, or Firm*—Koppel, Patrick, Heybl & Dawson

(57) ABSTRACT

Methods and structures are provided for generating a digital display signal in response to an analog display signal whose amplitude varies at a pixel rate and in response to a synchronization signal that defines spatial order for the analog display signal. The structures include a transform generator for providing a Fourier transform of the digital display signal and a transform analyzer which generates frequency and phase control signals in respective response to the frequency of an error spectral component and amplitudes of image spectral components in the transform. The frequency and control signals are applied to respectively adjust the sample rate of the sample clock and alter the phase of the sample clock.

21 Claims, 6 Drawing Sheets

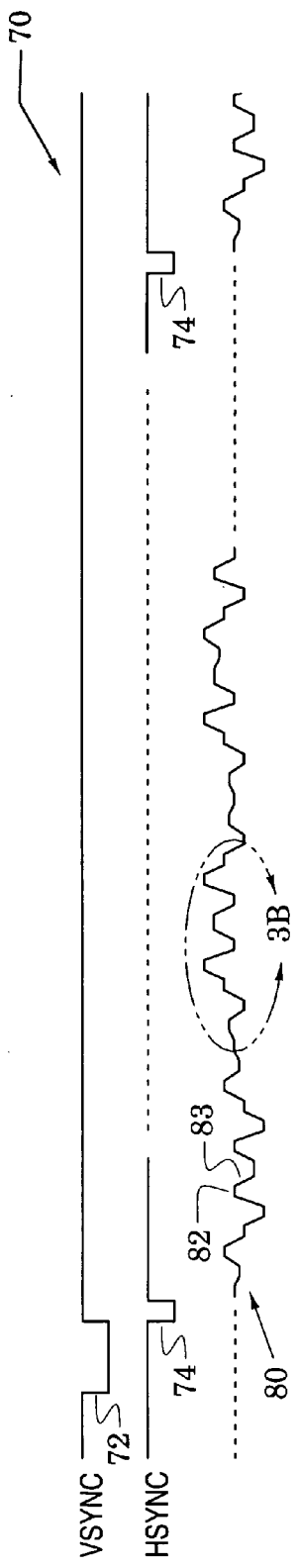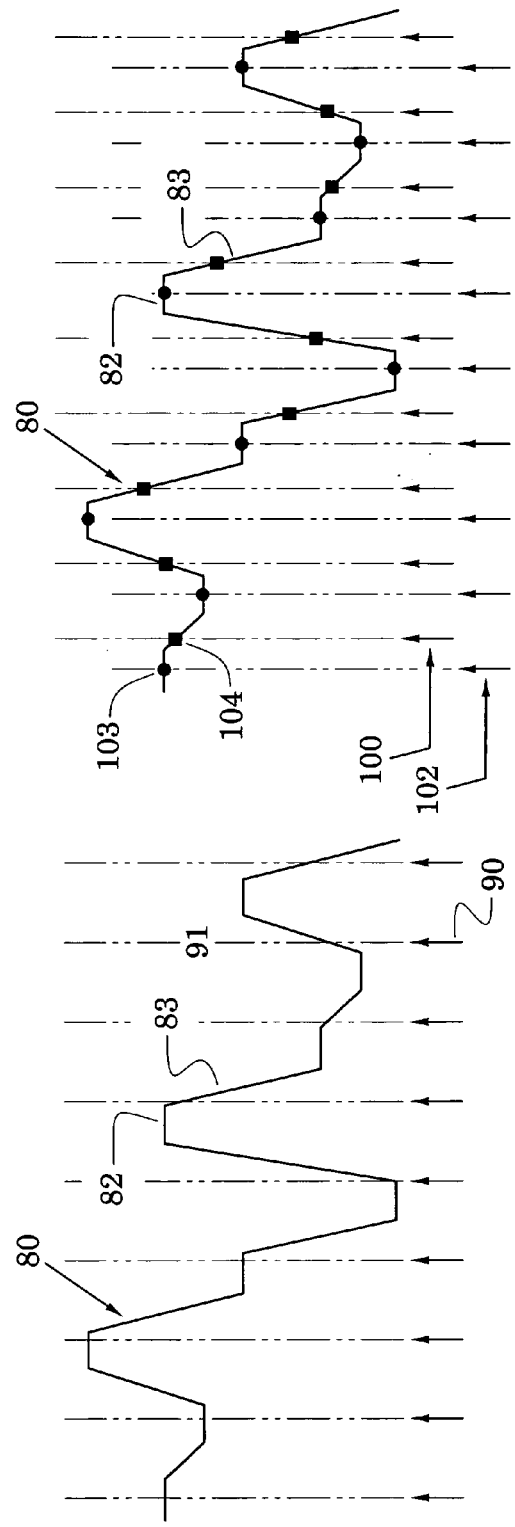
FIG. 3A
FIG. 3B
FIG. 3C

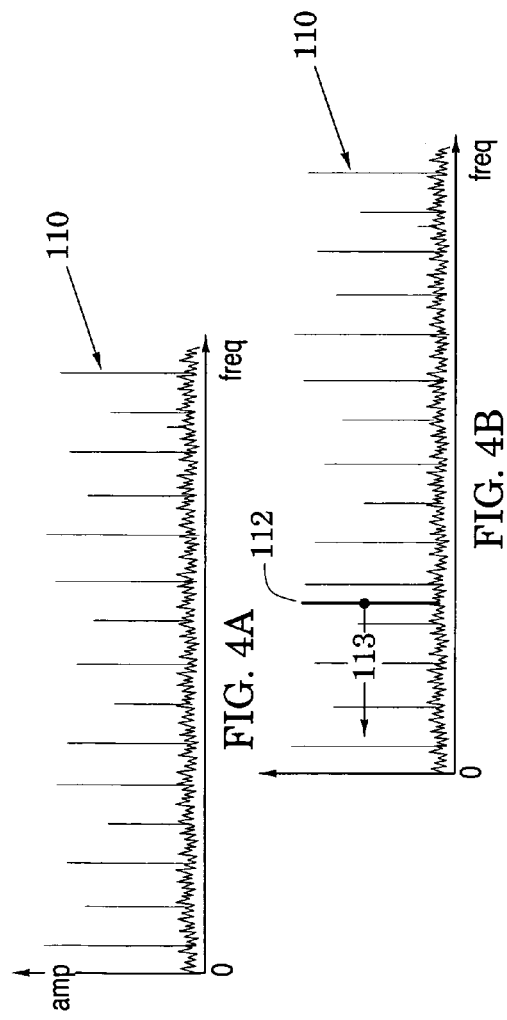
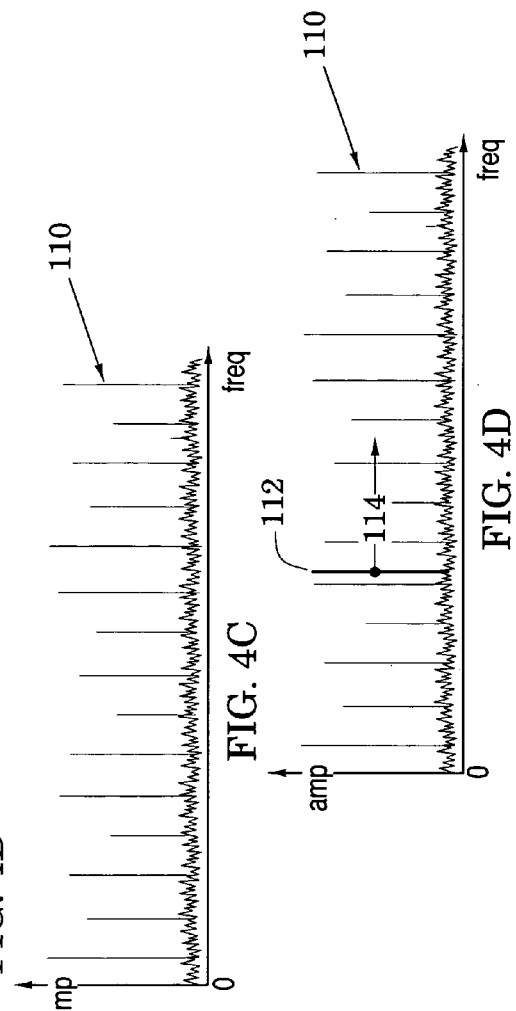

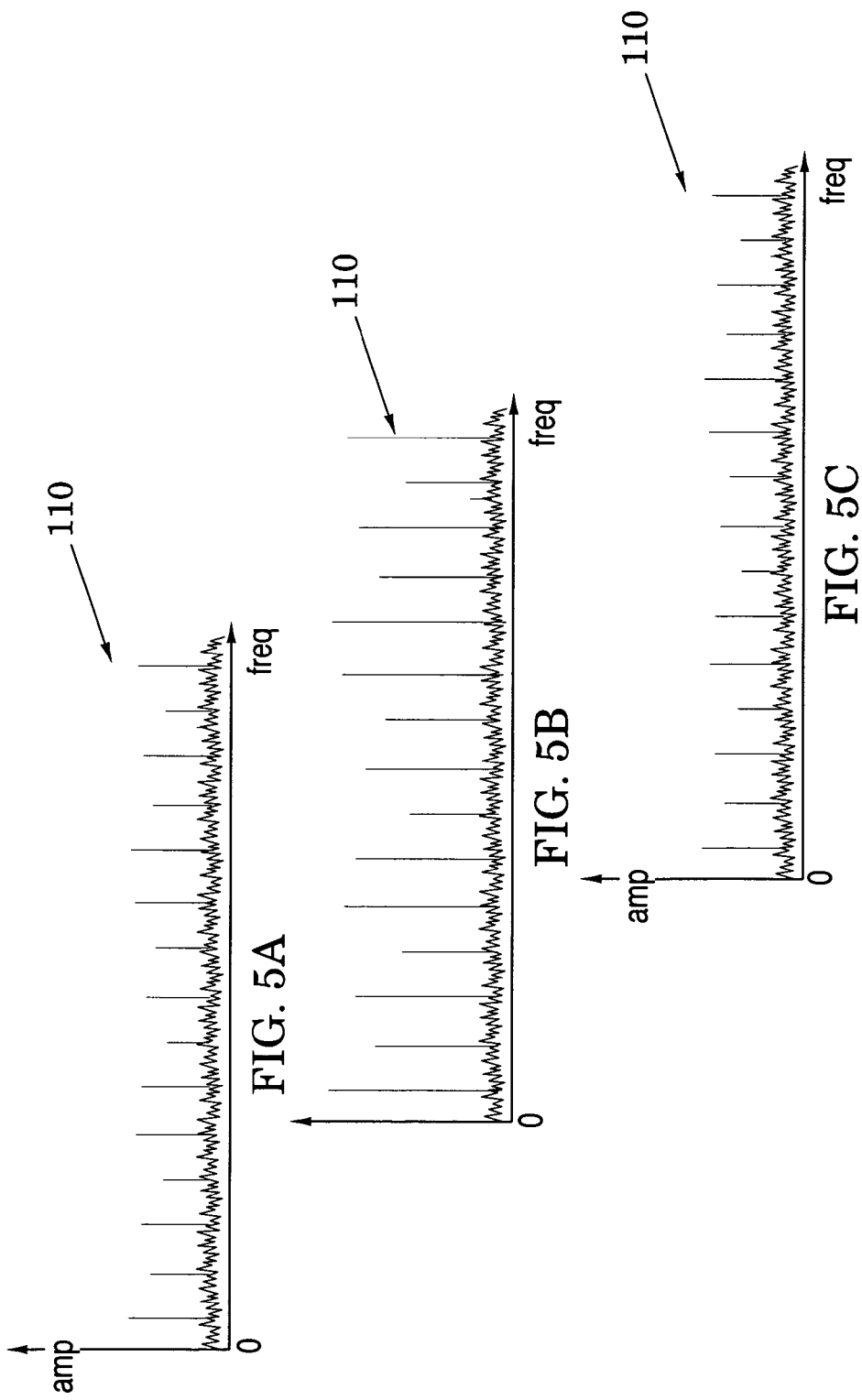

SPECTRALLY-ADJUSTED SAMPLING METHODS AND STRUCTURES FOR DIGITAL DISPLAYS

BACKGROUND OF THE INVENTION

1. Field of the Invention

The present invention relates generally to digital displays and, more particularly, to analog interfaces that adapt analog display signals to digital displays.

2. Description of the Related Art

The cathode ray tube (CRT) has been the standard computer-display monitor for many years. Because CRTs have generally responded to analog display signals, there currently exists an extremely large installed base of computers (more than a billion) that incorporate digital-to-analog converters (DACs) configured to generate CRT analog display signals.

Recently, digital display devices (e.g., flat-panel displays, liquid crystal displays, projectors, digital television displays and near-to-eye displays) have become increasingly popular. Although it is anticipated that all-digital interfaces will eventually become the standard interface for these displays, analog interfaces must be available for the near future because of the large existing installation base of computers.

Analog-to-digital converters are typically used to adapt the analog display signals to a flat-panel display. The converters generally include high-speed samplers that provide analog samples which the converters then quantize into the desired digital display signals.

In order to assure accurate analog samples, the sample clock that actuates the samplers must be extremely stable (i.e., have low jitter). For example, a 640×480 picture element (pixel) display with a typical refresh rate has a pixel time on the order of 40 nanoseconds but a large 1280×1024 pixel display reduces the pixel time to 8–9 nanoseconds. Because rise and fall times and ringing further reduce the time that each pixel's analog state is valid, accurate control of ADC samplers has been a persistent problem in analog interface structures.

BRIEF SUMMARY OF THE INVENTION

The present invention is directed to methods and structures that spectrally adjust and alter a sample clock to enhance accuracy of a digital display signal. The novel features of the invention are set forth with particularity in the appended claims. The invention will be best understood from the following description when read in conjunction with the accompanying drawings.

BRIEF DESCRIPTION OF THE DRAWINGS

FIG. 3A is a graph of an analog display signal in the analog interface of FIG. 2 and of synchronization signals that define spatial order for the analog display signal;

FIGS. 3B and 3C are enlargements of a portion of the analog display signal of FIG. 3A that facilitate description of sampling adjustment methods in the analog interface of FIG. 2;

FIGS. 4A–4D are graphs that illustrate reduction of an error frequency in an error spectral component of a digital display signal in the analog interface of FIG. 2;

FIGS. 5A–5C are graphs that illustrate reduction of amplitudes of image spectral components of the digital display signal.

DETAILED DESCRIPTION OF THE INVENTION

Spectrally-adjusted sampling methods and structures are described below, with reference to FIGS. 1–6, for generating digital display signals from analog display signals and a synchronization signal that defines spatial order of the analog display signals. These methods and structures provide a spectral representation (e.g., spectral lines versus spectral frequency) of the digital display signals and adjust at least one of the frequency and phase of a sample clock to enhance a visual display generated by the digital display signals.

The structures include a transform generator for providing a Fourier transform of the digital display signal and a transform analyzer which generates frequency and phase control signals in respective response to the frequency of an error spectral component and amplitudes of image spectral components in the transform. The frequency and control signals are applied to respectively adjust the sample rate of the sample clock and alter the phase of the sample clock.

Figure 1:
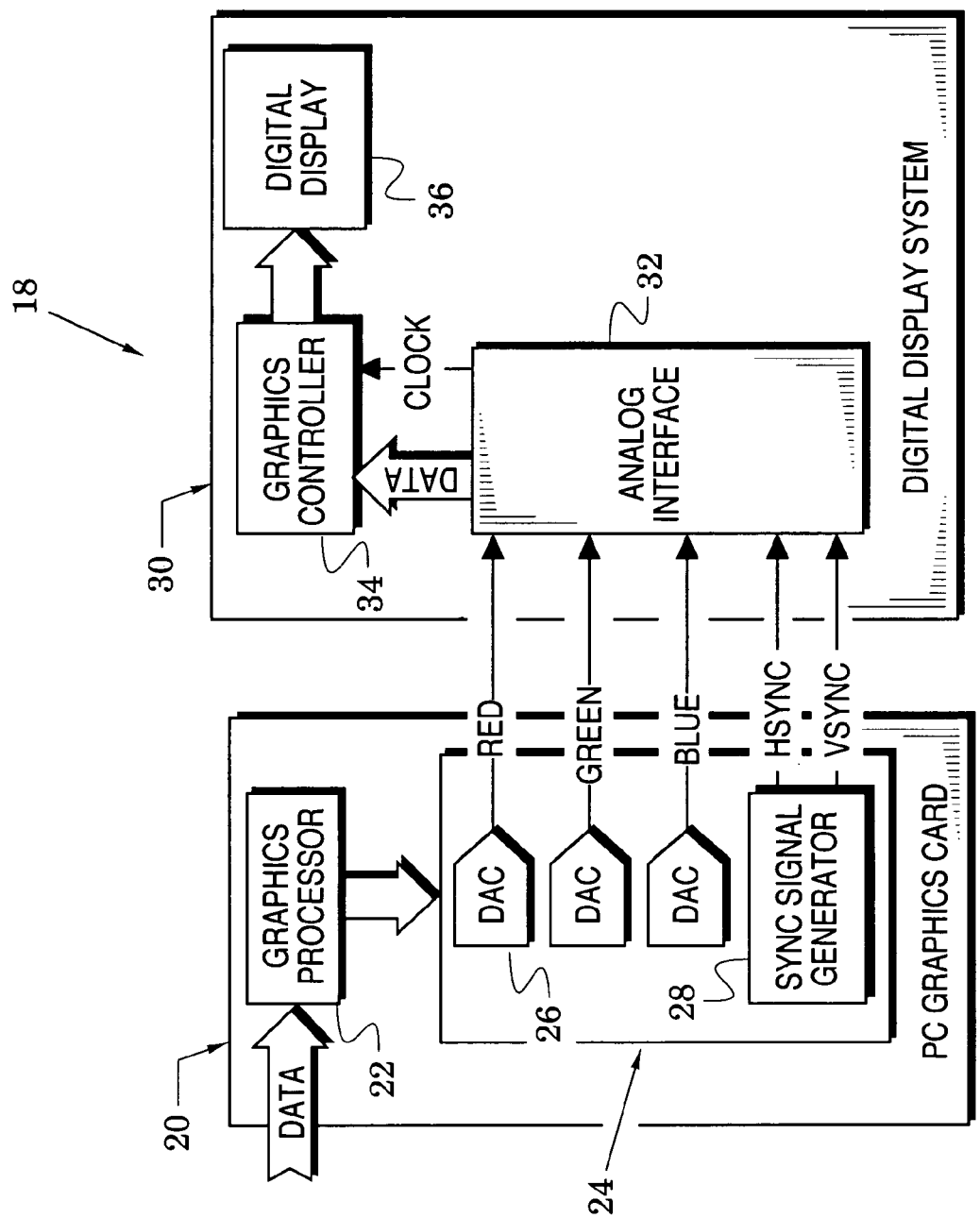
FIG. 1 is a block diagram that includes a digital display system embodiment of the present invention.

In particular, FIG. 1 illustrates structure embodiments 18 of the present invention for coupling display signals from an exemplary personal computer (pc) graphics card 20 to a digital display system 30. The graphics card 20 includes a graphics processor 22 and a signal converter 24. The signal converter comprises a set of digital-to-analog converters (DACs) 26 and a sync signal generator 28.

In operation of the graphics card 20, the graphics processor 22 renders data from a computer's central processing unit (not shown) into a graphics-oriented format which is passed to the signal converter 24. The DACs 26 convert elements of the graphics formatted data into analog display signals that each contain analog information (coded, for example, in 256 analog levels) sufficient to generate one of the red, green and blue pixel components of an analog image (e.g., on a CRT). The sync signal generator 28 also responds to elements of the data from the graphics processor 22 by generating synchronization signals which define spatial order for the analog display signals (i.e., the spatial order of display pixels).

The digital display system 30 includes an analog interface 32, a graphics controller 34 and a digital display 36 (e.g., a liquid crystal display panel) which responds to digital display signals. In operation, the analog interface receives the red, green and blue analog display signals and their corresponding synchronization signals from the pc graphics card 20 and converts them to digital display signals (shown as DATA) and a corresponding clock signal. The graphics controller 34 receives these signals from the analog interface and processes them in accordance with the particular format required by the digital display 36. Accordingly, a respective graphics controller is generally configured to be compatible with each specific type of digital display.

Figure 2:
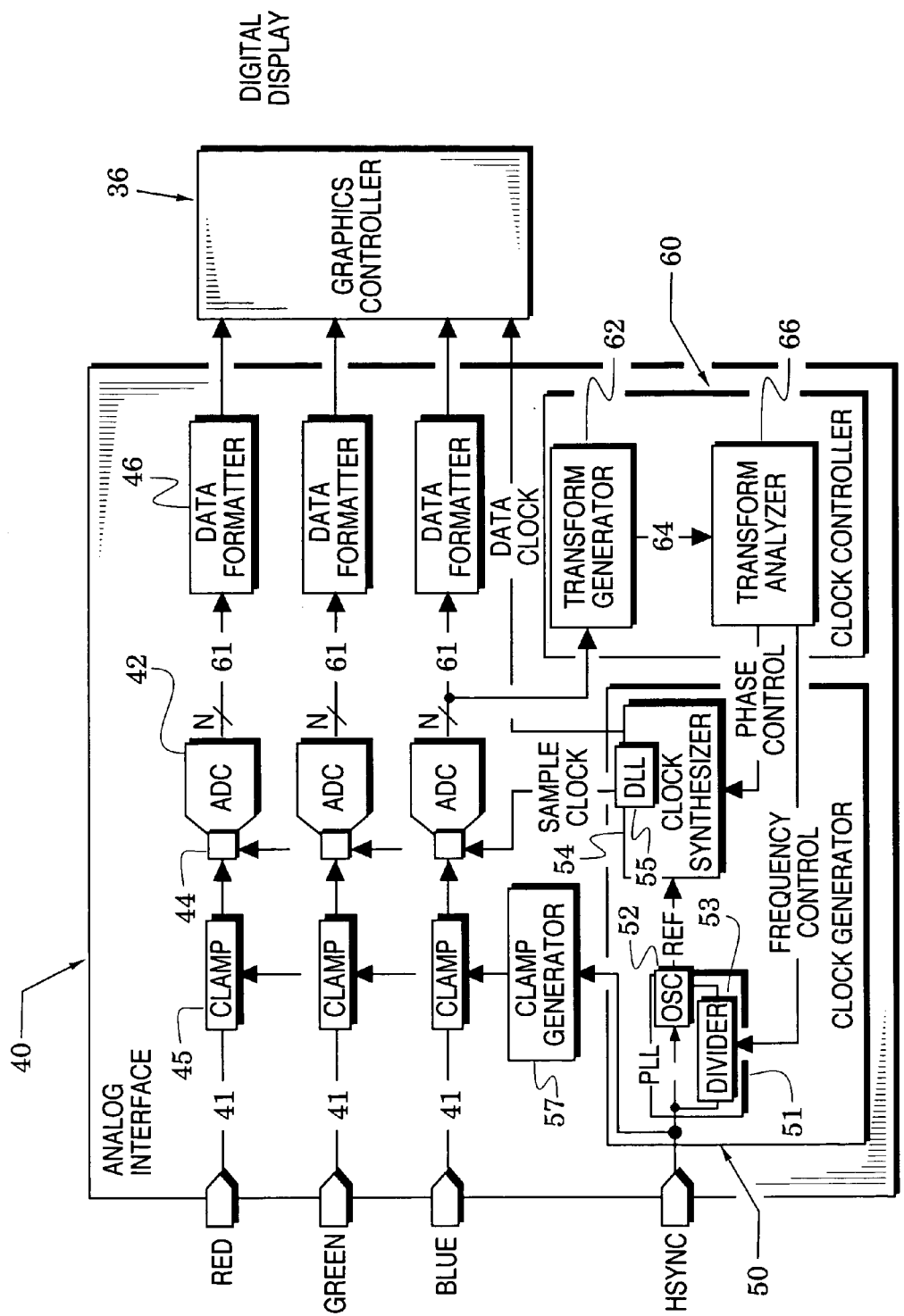
FIG. 2 is a block diagram that shows an analog interface embodiment for the display system of FIG. 1.

In transit to the analog interface 32, the phase relationship between the synchronization signals and the red, green and blue analog display signals is typically lost and this relationship must be reconstructed in the analog interface 32. FIG. 2 illustrates an embodiment 40 of the analog interface which is particularly suited for this task. It includes, for each of the red, green and blue analog display signals 41, an analog-to-digital converter (ADC) 42 and an associated sampler 44 that are coupled between a clamp 45 and a data formatter 46 which is specifically configured for compatibility with the digital display of FIG. 1 via the graphics controller 34. To enhance their conversion speed, the ADCs may comprise more than one converter stage, e.g., they may be pipelined ADCs.

The analog interface 40 further includes a clock generator 50 and a clock controller 60 wherein the controller provides frequency and phase control signals to the clock generator in response to at least one of the N-bit digital display signals 61 that are generated by the ADCs 42. The clock generator 50 receives synchronization signals from the sync signal generator 28 of FIG. 1 and the frequency and phase control signals from the clock controller 60 and, in response, provides a sample clock which activates the samplers 44.

In one embodiment, the clock generator 50 has a phase-locked loop (PLL) 51 and a clock synthesizer 54. The PLL 51 provides a reference signal REF which it phase locks to a synchronization signal (in particular, a HSYNC signal) from the sync signal generator 28 of FIG. 1. The PLL includes an oscillator 52 which provides the reference signal and a divider 53 that divides, in response to the frequency control signal, the reference signal by a selected divisor to provide a divided reference signal.

Feedback of the PLL (conventional PLL details are not shown) reduces the phase difference between the HSYNC signal and the divided reference signal so that the frequency of the reference signal is a product of the divisor and the frequency of the HSYNC signal. If the divisor, for example, is selected by the frequency control signal to be 1350, then the frequency of the reference signal is adjusted to be 1350 times the frequency of the HSYNC signal.

The clock synthesizer 54 generates the sample clock with the same frequency as that of the reference signal and alters the phase of the sample clock in response to the phase control signal from the clock controller 60. In a system embodiment, the clock synthesizer is formed with a delay-locked loop (DLL) 55. Delay-locked loops generally have a phase detector and a delay line formed of variable delay buffers. In this DLL embodiment, the reference signal drives the delay line and an output signal from the delay line is provided to the phase detector along with the reference signal.

In response to the reference and output signals, the phase detector generates an error signal which is applied to the buffers to adjust their delays sufficiently to cause the output signal and the reference signal to be in phase which means the output signal is now delayed by exactly one clock period. Accordingly, signals from the buffers are successively delayed versions of the reference signal. A 6-bit DLL, for example, can provide a sample clock whose phase is selectably altered with a resolution of 5.625 (360/64) degrees.

As previously stated, the synchronization signals define spatial order for the analog display signals. The graph 70 of FIG. 3A shows, for example, a VSYNC signal in which a VSYNC pulse 72 initiates each frame of the analog display signals. In response to each VSYNC pulse, an HSYNC signal provides a series of HSYNC pulses 74 that each initiate a respective line of pixels in the VSYNC pulse's frame.

In response to each HSYNC pulse 74, discrete pixel levels are defined at a pixel rate in an analog display signal 80 of FIG. 3A by action of the DACs 26 of FIG. 1. For example, if the DACs are 8-bit DACs, each pixel can take on a respective one of 256 analog levels 82. Due to circuit parasitics (e.g., parasitic capacitances) and limited circuit bandwidths, these levels do not change instantaneously into a succeeding pulse level but, rather, change with the exemplary rise and fall slopes 83 shown in FIG. 3A.

In order to set the "black level" of each ADC 42 of FIG. 2, a clamp generator 57 provides information as to the location of the "back porch" which is located between each HSYNC signal and the first pixel of its respective line. At this location, the clamp generator 57 commands the clamps 45 to establish a predetermined clamp level (e.g., 0 volts) for each ADC. Although not shown, offset and gain adjustments are typically provided to each ADC 42 to set the brightness and contrast of the red, green and blue pixels on the digital display 36.

Each frame line that is initiated by one of the HSYNC pulses 74 of FIG. 3A should have a predetermined number of pixels occurring at a pixel rate. To provide an accurate sample of each of these pixels, the sample clock must accurately provide a corresponding sample pulse to the samplers (44 in FIG. 2) Accordingly, the divider (53 in FIG. 2) divides the reference signal so that it can be phase locked to an appropriate multiple of the HSYNC signal. For example, the graphics card (20 in FIG. 1) may generate 1280 pixels per display line with an additional 70 pixel locations during HSYNC and blanking for a total of 1350 pixel times per display line. As previously described, the divisor of the divider can then be set to 1350 by the frequency control signal so that the frequency of the reference signal is adjusted to be 1350 times the frequency of the HSYNC signal.

The clock synthesizer 54 of FIG. 2 must then introduce a phase shift (e.g., a delay) in the reference signal so that each pulse of the sample clock is appropriately positioned in a respective one of the analog levels 82 of FIG. 3A. FIGS. 3B and 3C are enlargements of the area within the curved line 3B of the analog display signal 80 of FIG. 3A. These figures indicate each pulse of the sample clock as an upward-pointed arrow 90 which is extended by a broken extension line 91. FIG. 3B illustrates a situation in which the divider 53 of the PLL 52 of FIG. 2 is set in error so that the sample rate of the sample clock is lower than the actual pixel rate. Accordingly, the sample pulse at the left side of FIG. 3B is accurately positioned to sample a respective pixel level 82 but the sample pulse at the right side is displaced from its respective pixel level.

FIG. 3C illustrates first and second different situations in which the divider 53 of the PLL 51 is now correctly set so that the sample rate equals the pixel rate. However, in the first situation, the phase shift of the clock synthesizer 54 of FIG. 2 is in error so that each pulse of a first set 100 of sample pulses is displaced by the same time interval from its respective pixel level 82. In the second situation, the phase shift of the clock synthesizer 54 is now correctly set so that each pulse of a second set 102 of sample pulses is accurately positioned to sample a respective pixel level 82.

The present invention recognizes that the frequency error illustrated in FIG. 3B and the phase error illustrated by the first set 100 of FIG. 3C will each degrade the display quality of the digital display signals 61 of FIG. 2 and this degradation can be correlated to observations of corresponding parameters in a spectral representation of the digital display signal. The invention further recognizes that the frequency and phase of the sample clock (generated by the clock synthesizer 54 of FIG. 2) can then be properly controlled by adjusting and altering them until the observed parameters are brought to preferred conditions. At this point, the digital display signals will be substantially corrected so that the quality of the display on the digital display (36 in FIG. 1) is also substantially enhanced.

Directing attention initially to the frequency of the sample clock, it is noted that signal sampling processes essentially perform a mixing function so that the frequency spectrum of a sampled signal includes the sum and difference of the sampling signal and the input signal and harmonics and combinations thereof. It is noted that the analog display signal 80 of FIG. 3B will contain a strong frequency component that is generated by the abrupt transition of the signal from one pixel level to the next. Accordingly, this frequency component will be at the pixel frequency.

When the analog display signal is sampled exactly at the pixel rate, this strong component is mixed with the sampling signal and the resulting difference frequency is zero. The sum is twice the sampling frequency, which folds back to zero as well. However, if the sample rate differs from the pixel rate an error spectral component is generated having an error frequency that represents an observable parameter. The error frequency is a function of the difference between the sample rate and the pixel rate.

In the example previously discussed, the pixel rate in the analog display signals (41 in FIG. 2) was 1350 pixels per display line. If the sample rate of the sample clock in FIG. 2 is adjusted so that there are 1351 clocks per display line, the error spectral component will appear at a frequency of 1/1351 of the sampling frequency. If the sample rate is adjusted so that there are 1352 clocks per display line, the error spectral component will appear at a frequency of 2/1352 of the sampling frequency. If the frequency of the sample rate is adjusted so that the pixels per display line vary from 1300 to 1400, the error spectral component will decrease from a frequency of 50/1300 of the sampling frequency to zero and then subsequently increase to 50/1400 of the sampling frequency. The rate at which this error spectral component moves will be set by the rate at which the sample rate moves over the indicated range.

The spectral representation of the digital display signal will also contain a plurality of image spectral components which are a function of the image currently represented in the analog display signals 41 of FIG. 2. Because the spectral content of this image will generally be changing at a rate substantially slower than the frame rate, it is easy to vary the sample rate at a substantially-higher rate so that the image spectral components appear to be substantially fixed.

For example, FIG. 4A shows a plurality of image spectral components 110. As the sample rate is increased in FIG. 4B from a rate lower than the pixel rate, the image spectral components 110 remain relatively fixed but an error spectral component 112 comes into view as it exhibits movement 113 towards zero frequency. When the sample rate matches the pixel rate in FIG. 4C, the image spectral components 110 continue to be relatively fixed and the error spectral component 112 has vanished because it now is at zero frequency. As the sample rate is then increased in FIG. 4D from the pixel rate, the image spectral components 110 continue to be relatively fixed as the error spectral component 112 exhibits movement 114 upward from zero frequency.

The error spectral component 112 can thus be distinguished by noting spectral displacements of spectral components for different selected sample rates and identifying the error spectral component as that spectral component exhibiting the greatest spectral displacement. An exemplary method may include the steps of selecting first and second sample rates and then, against a background of substantially-stationary spectral components, identifying a spectral component which exhibits substantial spectral displacement as the error spectral component. Another exemplary method may note first and second displacements of the error spectral component 112 for first and second sample rates after which the transform analyzer can calculate the sample rate that will position the error spectral component at zero frequency.

To manage the spectral representations described above, the clock controller 60 of FIG. 2 includes a transform generator 62 which is configured to generate a Fourier transform 64 (e.g., a discrete Fourier transform (DFT) or a fast Fourier transform (FFT)) of the digital display signal 61 of at least one of the ADCs 42. The clock controller also includes a transform analyzer 66 which is configured to respond to the Fourier transform and provide the frequency control signal to the divider 53 and the phase control signal to the clock synthesizer (which may include the DLL 55).

In particular, the transform analyzer is configured to identify the error spectral component (e.g., 112 in FIGS. 4B and 4D) as that spectral component of the Fourier transform which exhibits the greatest spectral displacement in response to variations in the frequency control signal (i.e., the image spectral components 110 remain relatively fixed). Having distinguished the error spectral component, the transform analyzer then adjusts the frequency control signal of FIG. 2 to provide a sample rate of the sample clock that reduces the error frequency (e.g., reduces it to zero).

Once the sample rate has been properly set, the present invention recognizes that a phase error of the sample clock of FIG. 2 will cause a reduction of various spectral components of the Fourier transform 64. This may be observed by placing black dots 103 on the pixel levels in FIG. 3C that are indicated by the second set 102 of sample pulses which are each accurately positioned on a respective pixel and by placing black squares 104 on the pixel levels in that are indicated by the first set 102 of sample pulses which are each displaced from a respective pixel.

It is noted that the amplitude of a curve passing through the dots is substantially greater than the amplitude of a curve passing through the squares. Obviously the amplitude reaches a maximum when the sample pulses are positioned on the pixel levels and decreases from this maximum when they are displaced.

For example, FIG. 5B shows the plurality of image spectral components 110 of FIG. 4A wherein it is assumed that the sample rate matches the pixel rate and the phase of the sample pulses corresponds to that of the second set 102 of sample pulses in FIG. 3C. FIGS. 5A and 5C then show the image spectral components as the sample pulses are displaced to one side in FIG. 5A and to another side in FIG. 5C. The image spectral components have a greatest amplitude in FIG. 5B and decrease from that amplitude in FIGS. 5A and 5C.

The transform analyzer (66 in FIG. 2) is therefore configured to monitor the amplitude of the image spectral components and alter the phase of the sample clock (via, for example, the DLL 55 in FIG. 2) to increase (e.g., maximize) the amplitude of the image spectral components 110 as shown in FIG. 5B. Essentially, the transform generator (62 in FIG. 1) and the transform analyzer provide feedback information gathered from spectral components of the Fourier transform to thereby facilitate adjustment of the sample rate and alteration of the sample phase.

It is noted that the amplitude variations of the image spectral components 110 will be evident only after the sample rate has been properly adjusted. When the sample rate is still in error, significant phase rotation will be occurring across each display line so that it will be difficult to observe the amplitude variations of FIGS. 5A–5C that result from phase alteration of the sample clock.

Accordingly, another process embodiment of the invention for adjusting the sample rate concentrates on the amplitude of the image spectral components. With a first sample rate established, for example, the phase of the sample clock is rotated while observing the amplitude of the image spectral components. If the amplitude remains substantially constant (e.g., as in FIGS. 5A and 5C), it is apparent from the above observations that the sample rate is in error. The sample rate can then be adjusted to a second sample rate after which the phase of the sample clock is again rotated and the amplitude of the image spectral components again observed.

Sufficient repetition of this process will produce one particular sample rate for which the amplitude of the image spectral components changes significantly (e.g., as in FIG. 5B relative to FIGS. 5A and 5C) as the phase of the sample clock is rotated. Not only will this particular sample rate be the correct sample rate but the phase can then continue to be altered to increase (e.g., maximize) the amplitude of the image spectral components 110 as shown in FIG. 5B. In this process embodiment, the sample rate is adjusted by finding the one sample rate for which the amplitude of the image spectral components changes significantly as the phase of the sample clock is rotated and then selecting the one phase that maximizes the amplitude of the image spectral components.

Figure 6:
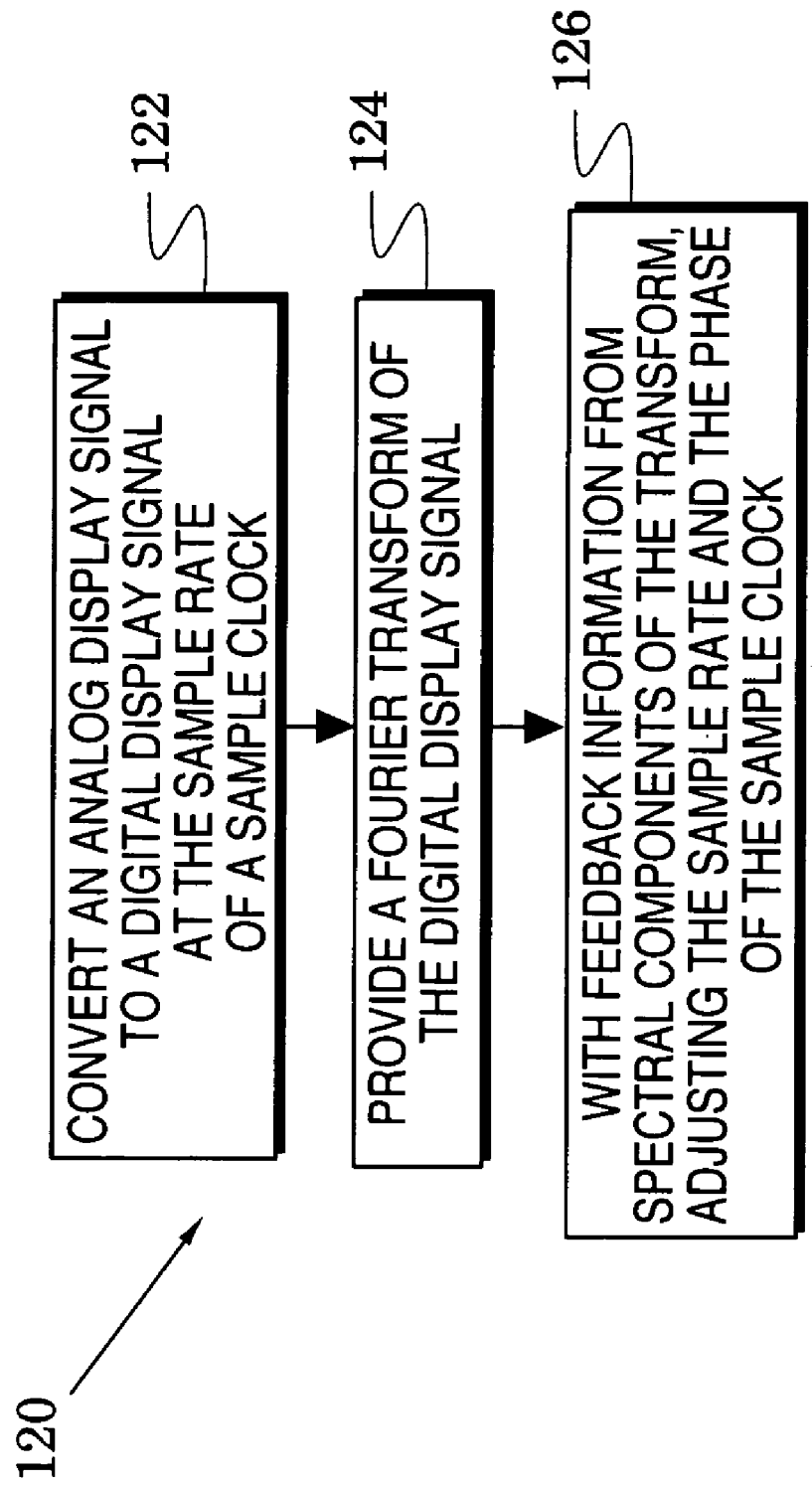
FIG. 6 is a flow chart that illustrates process steps facilitated by the analog interface of FIG. 2.

FIG. 6 shows a flow chart 120 that includes process steps that are broadly directed to some of the spectral observations illustrated in FIGS. 4A–4D and FIGS. 5A–5C and described above. In a first process step 122 of the flow chart, an analog display signal is converted to a digital display signal at the sample rate of a sample clock (e.g., by the ADCs 42 of FIG. 2). In a second process step 124, a Fourier transform of the digital display signal is provided (e.g., by the transform generator 62 of FIG. 2). With feedback information from spectral components of the transform, the sample rate is then appropriately adjusted and the phase of the sample clock appropriately altered (e.g., by the transform analyzer 66 of FIG. 2).

It is noted that the clock controller 60 of FIG. 2 can be realized to perform the processes described herein (e.g., as shown in the flow chart 120 of FIG. 6) with various conventional structures, e.g., at least one of an array of gates, an appropriately-programmed digital processor or a combination thereof.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of generating a digital display signal from an analog display signal whose amplitude varies at a pixel rate, the method comprising the steps of:
   converting said analog display signal to said digital display signal at the sample rate of a sample clock;
   providing a Fourier transform of said digital display signal; and
   with feedback information from spectral components of said transform, adjusting said sample rate to substantially match said pixel rate;
   wherein said adjusting step includes the steps of:
   for each of different sample rates, altering the phase of the sample clock; and
   setting said sample rate to a selected sample rate for which the spectral amplitude of said spectral components significantly changes during said altering step.

2. The method of claim 1, wherein:
   said converting step includes the step of dividing a display synchronization signal by a selected divisor to provide said sample clock; and
   said adjusting step includes the step of selectably changing said divisor.

3. The method of claim 1, further including the step of, with said selected sample rate, further altering said phase to maximize said spectral amplitude.

4. A method of generating a digital display signal from an analog display signal whose amplitude varies at a pixel rate, the method comprising the steps of:
   converting said analog display signal to said digital display signal at the sample rate of a sample clock;
   providing a Fourier transform of said digital display signal; and
   with feedback information from spectral components of said transform, adjusting said sample rate to substantially match said pixel rate;
   wherein said adjusting step includes the steps of:
   for each of different sample rates, observing the error frequency of an error spectral component in said transform; and
   setting said sample rate to a selected sample rate for which said error frequency is substantially zero.

5. The method of claim 4, wherein said observing step includes the steps of:
   selecting at least first and second sample rates; and
   against a background of substantially-stationary spectral components, identifying a spectral component which exhibits substantial spectral displacement as said error spectral component.

6. The method of claim 4, further including the step of altering the phase of said sample clock to maximize the amplitude of at least one spectral component in said transform.

7. The method of claim 4, wherein:
   said converting step includes the step of dividing a display synchronization signal by a selected divisor to provide said sample clock; and
   said adjusting step includes the step of selectably changing said divisor.

8. An analog interface which generates a digital display signal in response to an analog display signal whose amplitude varies at a pixel rate and in response to a synchronization signal that defines spatial order for said analog display signal, the interface comprising:
   a clock generator configured to respond to said synchronization signal and provide a sample clock having an adjustable sample rate and an alterable phase;
   at least one analog-to-digital converter that converts said analog display signal to said digital display signal in response to said sample clock; and
   a clock controller configured to:
   a) provide a Fourier transform of said digital display signal; and
   b) with feedback information from spectral components of said transform, adjust said sample rate to substantially match said pixel rate.

9. The interface of claim 8, wherein said clock controller is further configured to:
   alter, for each of different sample rates, said phase; and set said sample rate to a selected sample rate for which the spectral amplitude of said spectral components significantly changes as said phase is altered.

10. The interface of claim 9, wherein said clock controller is configured to further alter, with said selected sample rate, said phase to maximize said spectral amplitude.

11. The interface of claim 10, wherein said clock controller includes:
   a transform generator that responds to said digital display signal and provides said transform; and
   a transform analyzer that responds to said transform and provides a frequency control signal and a phase control signal to said clock generator to respectively adjust said sample rate and said phase.

12. The interface of claim 8, wherein said clock controller is further configured to:
   for each of different sample rates, observe the error frequency of an error spectral component in said transform; and
   adjust said sample rate to a selected sample rate for which said error frequency is substantially zero.

13. The interface of claim 12, wherein said clock controller is further configured to:
   select at least first and second sample rates; and
   against a background of substantially-stationary spectral components, identify a spectral component which exhibits substantial spectral displacement as said error spectral component.

14. The interface of claim 12, wherein said clock controller is configured to alter, with said selected sample rate, said phase to maximize the spectral amplitude of said spectral components.

15. The interface of claim 14, wherein said clock controller includes:
   a transform generator that responds to said digital display signal and provides said transform; and
   a transform analyzer that responds to said transform and provides a frequency control signal and a phase control signal to said clock generator to respectively adjust said sample rate and said phase;
   and wherein said transform analyzer is configured to:
   identify said error spectral component as that spectral component of said transform which exhibits the greatest spectral displacement in response to variations in said frequency control signal; and
   adjust said frequency control signal to thereby reduce said error frequency.

16. The interface of claim 14, wherein said clock generator includes:
   a phase-locked loop that has:
      a) a frequency divider which divides a reference signal into a divided reference signal with a divisor selected by said frequency control signal; and
      b) an oscillator that generates said reference signal with a frequency that reduces the phase difference between said synchronization signal and said divided reference signal; and
   a clock synthesizer that generates said sample clock in response to said reference signal and alters said phase in response to said phase control signal.

17. The interface of claim 16, wherein said clock synthesizer is a delay-locked loop.

18. The interface of claim 8, wherein said controller comprises at least one of an array of logic gates and an appropriately-programmed digital processor.

19. A display system which generates a visual display in response to an analog display signal whose amplitude varies at a pixel rate and in response to a synchronization signal that defines spatial order for said analog display signal, the system comprising:
   a clock generator configured to respond to said synchronization signal and provide a sample clock having an adjustable sample rate and an alterable phase;
   at least one analog-to-digital converter that converts said analog display signal to a digital display signal in response to said sample clock; and
   a clock controller configured to:
      a) provide a Fourier transform of said digital display signal; and
      b) with feedback information from spectral components of said transform, adjust said sample rate to substantially match said pixel rate; and
   a digital display that provides said visual display in response to said digital display signal.

20. The system of claim 19, wherein said clock controller includes:
   a transform generator that responds to said digital display signal and provides said transform; and
   a transform analyzer that responds to said transform and provides a frequency control signal and a phase control signal to said clock generator to respectively adjust said sample rate and said phase.

21. The system of claim 20, wherein said transform analyzer is configured to:
   for each of different sample rates, observe the error frequency of an error spectral component in said transform;
   adjust said sample rate to a selected sample rate for which said error frequency is substantially zero; and
   alter, with said selected sample rate, said phase to maximize the spectral amplitude of said spectral components.

* * * * *